(12) United States Patent
Chen et al.

(10) Patent No.: US 7,864,521 B2
(45) Date of Patent: Jan. 4, 2011

(54) ENCLOSURE FOR ELECTRONIC DEVICE

(75) Inventors: Yun-Lung Chen, Taipei Hsien (TW); Zhun-Liang Zhang, Shenzhen (CN); Pei-Bin Luo, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 19 days.

(21) Appl. No.: 12/487,298

(22) Filed: Jun. 18, 2009

(65) Prior Publication Data

US 2010/0172082 A1 Jul. 8, 2010

(30) Foreign Application Priority Data

Jan. 7, 2009 (CN) .................. 2009 2 0300086

(51) Int. Cl.
*G06F 1/16* (2006.01)
*H05K 7/16* (2006.01)
*A47B 81/00* (2006.01)
*A47F 7/00* (2006.01)

(52) U.S. Cl. .................. 361/679.33; 361/679.37; 361/726; 312/223.1; 312/223.2; 211/26

(58) Field of Classification Search ................. 361/679.01–679.45, 679.55–679.59, 724–727; 312/223.1, 223.2; 211/26; 361/752–755, 361/759
See application file for complete search history.

(56) References Cited

U.S. PATENT DOCUMENTS

| | | | | |
|---|---|---|---|---|
| 6,297,952 | B1 * | 10/2001 | Liu et al. ............... | 361/679.31 |
| 6,665,177 | B2 * | 12/2003 | Chen ..................... | 361/679.58 |
| 6,728,109 | B1 * | 4/2004 | Wu ........................... | 361/747 |
| 6,980,429 | B2 * | 12/2005 | Ericks et al. ........... | 361/679.32 |
| 7,180,734 | B2 * | 2/2007 | Jing ....................... | 361/679.33 |
| 7,384,106 | B2 * | 6/2008 | Lan ......................... | 312/223.2 |
| 7,543,786 | B2 * | 6/2009 | Yang ..................... | 248/222.51 |
| 7,611,100 | B2 * | 11/2009 | Peng et al. .................. | 248/27.1 |
| 2006/0044750 | A1 * | 3/2006 | Chen ......................... | 361/685 |
| 2006/0279938 | A1 * | 12/2006 | Tsai .......................... | 361/725 |
| 2009/0168326 | A1 * | 7/2009 | Chen et al. ............. | 361/679.39 |

* cited by examiner

*Primary Examiner*—Jayprakash N Gandhi
*Assistant Examiner*—Nidhi Desai
(74) *Attorney, Agent, or Firm*—D. Austin Bonderer

(57) ABSTRACT

An enclosure for electronic device, includes a chassis and a cover. The chassis defines an opening. The chassis includes a drive bracket mounted therein. The drive bracket includes a side plate facing the opening. A through hole is defined in the side plate. A rotating member is pivotally mounted on the side plate. The rotating member includes a positioning pin. A data storage device is received in the drive bracket. The data storage device defines a locking hole in alignment with the through hole of the side plate. The cover is mounted on the chassis to cover the opening of the chassis. The cover abuts the rotating member so that the positioning pin is inserted in the through hole and the locking hole to secure the data storage device in the drive bracket of the chassis.

13 Claims, 4 Drawing Sheets

ENCLOSURE FOR ELECTRONIC DEVICE

BACKGROUND

1. Technical Field

The present disclosure relates to an enclosure for an electronic device, and more particularly to an enclosure which can firmly seat data storage devices therein.

2. Description of Related Art

With the rapid development of computer technology, properties of computers have made a dramatic improvement. However, a computer is still expensive for a common consumer. Accordingly, expansion capacity and convenient installation are two vital factors to be considered when designing a computer. Various data storage devices are installed in a computer enclosure for communication and dealing with data. Such a device may be, for instance, a floppy disk drive, a CD-ROM/DVD-ROM drive, a CD-RW/DVD-RW drive or other similar device. Nowadays, a computer enclosure is tightly packed in order to keep the size of the system small to fit on or under a desk. A conventional data storage device is directly attached to a computer enclosure with screws. However, the screws are usually very small, therefore making it difficult for a computer user to hold the screws in position while screwing them in with a screwdriver. The screws are inserted into holes that are on the data storage device assembly and on the chassis to which the data storage device assembly is being attached. The holes are difficult to align because they are also typically very small. Also, if the tolerances are incorrect due to manufacturing defects, the holes may not line up exactly, making it difficult to insert the screws. Using screws to attach the data storage device to a computer enclosure may be arduous due to requiring insertion of the screws. Both insertion and removal of the screws are time consuming and cumbersome owing to the work space restrictions and difficult accessibility.

In addition, during the course of the operation of the data storage device, it may cause the data storage device to vibrate and loosen the screws. Understandably, some attempts have been taken to introduce a mounting apparatus for data storage devices without screws.

There is, however, room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
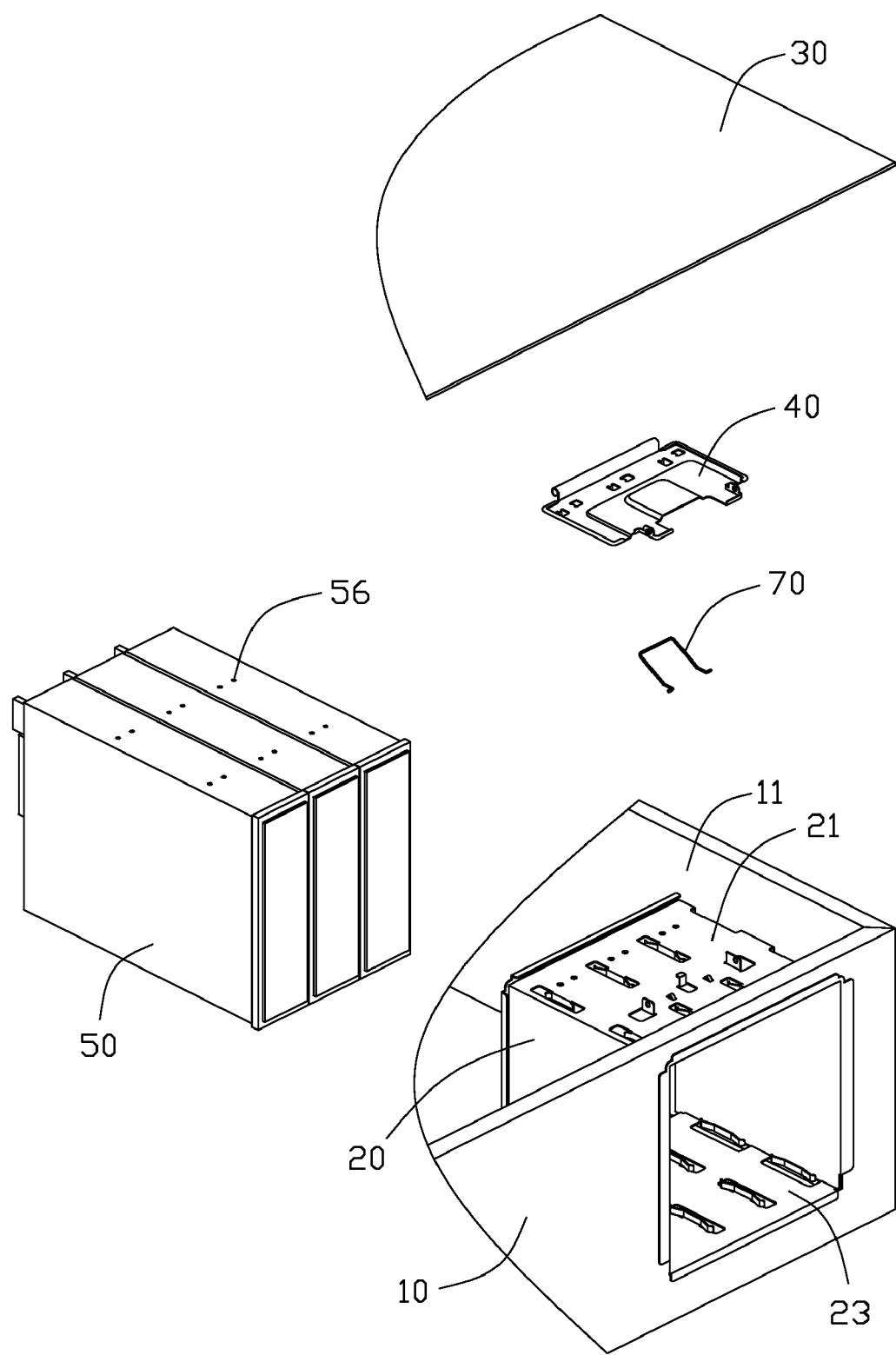
FIG. 1 is an isometric and exploded view of an enclosure for electronic device.
Figure 2:
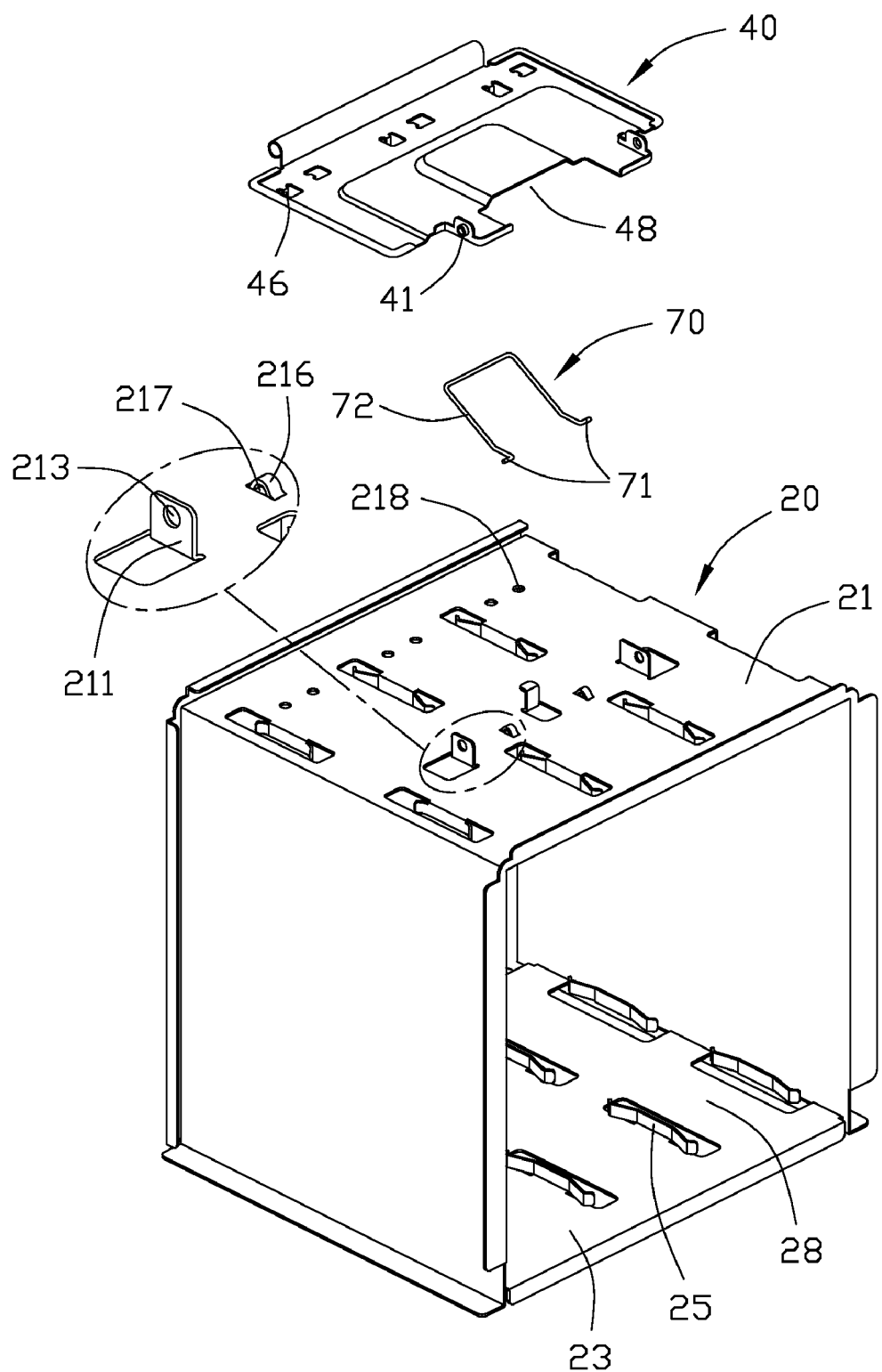
FIG. 2 is an exploded view of the drive bracket, the rotating member, and the elastic member of FIG. 1.
Figure 3:
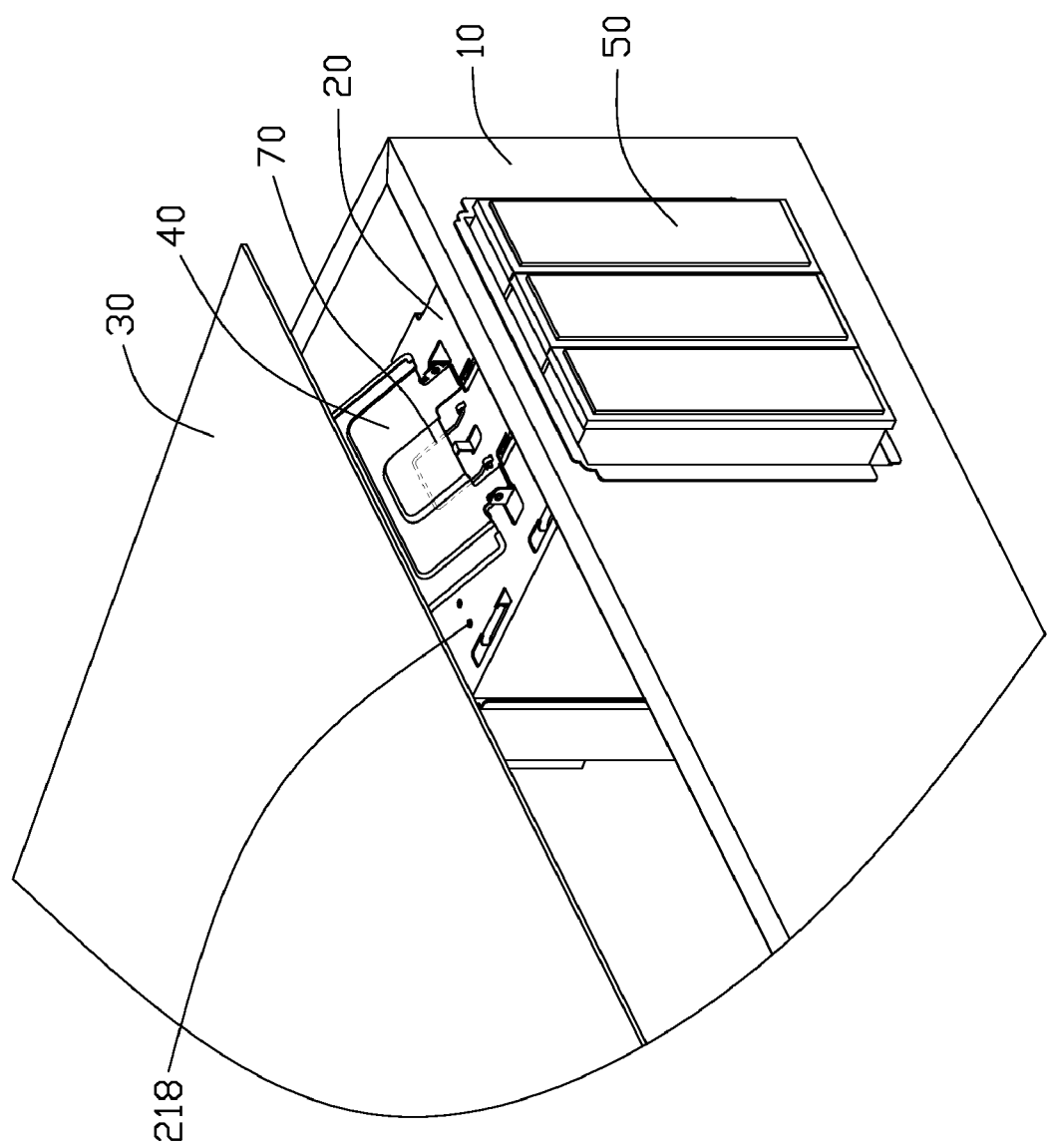
FIG. 3 is an partial-assembled view of the enclosure of FIG. 1.

Referring to FIGS. 1 and 2, an enclosure for an electronic device in accordance with an exemplary embodiment is shown. A plurality of data storage devices 50 is adapted to be mounted in the enclosure. In FIG. 1, there are three individual data storage devices 50. However, the number of the data storage devices 50 is not limited to three or other particular number. The number of the data storage device 50 can vary according to different requirement. The enclosure includes a chassis 10, a drive bracket 20 mounted in the chassis 10, a cover 30, a rotating member 40, and an elastic member 70.

The chassis 10 has an uncovered opening 11. The cover 30 is adapted to be mounted on the chassis 10 to cover the opening 11.

The drive bracket 20 has a pair of parallel side plates 21 and 23. Inner sides of the side plates 21 and 23 form a plurality of dividing pieces 25 thereon. As an example, three slideways 28 are shown to be defined between the dividing pieces 25. A side of the side plates 21, which faces the opening 11, forms a pair of flanges 211 and a pair of arches 216 thereon. The pair of arches 216 is located between the flanges 211. Each flange 211 defines a pivoting hole 213 therein. A receiving hole 217 is defined between each arch 216 and the side plate 21. A pair of through holes 218 is defined in the side plate 21 corresponding to each slideway 28.

The elastic member 70 includes a pair of parallel legs 72. One end of each of the legs 72 forms a foot 71, and the other ends of the legs 72 are connected to each other. The two feet 71 extend facing away from each other. The two legs 72 are tilted with respect to the two feet 71.

The rotating member 40 is adapted to rotate on the side plate 21 of the drive bracket 20. The rotating member 40 has a pair of pivoting pins 41 corresponding to the pivoting holes 213 of the side plate 21. A plurality of positioning pins 46 are formed on the rotating member 40 corresponding to the through holes 218 of the side plate 21. A side of the rotating member 40, which faces the side plate 21, defines a receiving space 48 therein for receiving the elastic member 70.

Each data storage device 50 defines a pair of locking holes 56 corresponding to the through holes 218 of the side plate 21.

Figure 4:
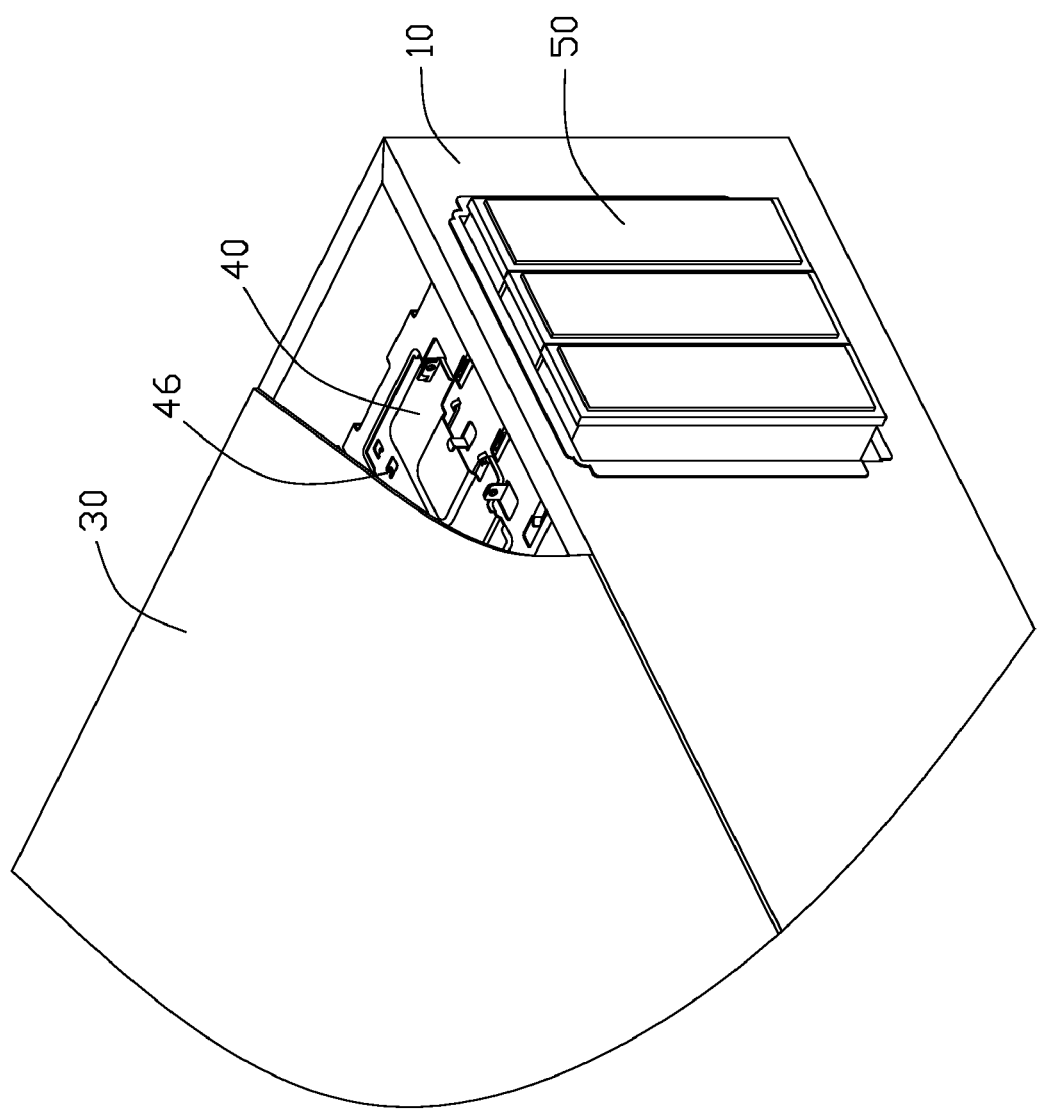
FIG. 4 is assembled view of the enclosure of FIG. 1.

Referring to FIGS. 1 and 4, the feet 71 of the elastic member 70 are pivotally inserted into the receiving holes 217 of the side plate 21. The elastic member 70 is tilted with respect to the side plate 21. The rotating member 40 is placed on the elastic member 70, and the pivoting pins 41 of the rotating member 40 are pivotally inserted into the pivoting holes 213 of the side plate 21.

The data storage device 50 then slides in a slideway 28 of the drive bracket 20. The locking holes 56 of the data storage device 50 are aligned with the through holes 218 of the side plate 21. The cover 30 is mounted on the chassis 10. The cover 30 contacts and impels the rotating member 40 and the elastic member 70 to rotate on the side plate 21. The positioning pins 46 of the rotating member 40 are inserted into the through holes 218 and the locking holes 56 to mount the data storage device 50 in the drive bracket 20 of the chassis 10. The elastic member 70 is elastically deformed to store an elastic force that can drive the rotating member 40 to rotate to remove the positioning pins 46 from the locking holes 56 after the cover 30 is detached from the chassis 10.

When the data storage device 50 needs to be detached from the chassis 10, the cover 30 is removed form the opening 11 of the chassis 10 so that it no longer presses the rotating member 40. The elastic member 70 rebounds to rotate the rotating member 40. The positioning pins 46 of the rotating member 40 slide out of the locking holes 56 of the data storage device 50. Therefore, the data storage device 50 can slide out of the slideway 28 of the drive bracket 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An enclosure for electronic device, comprising:
a chassis defining an opening, and comprising a drive bracket mounted therein; the drive bracket comprising a side plate facing the opening and a through hole defined in the side plate; a rotating member pivotally mounted on the side plate, the rotating member comprising a positioning pin inserted in the through hole; a data storage device received in the drive bracket, the data storage device defining a locking hole in alignment with the through hole of the side plate; and
a cover mounted on the chassis to cover the opening of the chassis, the cover abuts the rotating member rotating on the side plate so that the positioning pin is inserted in the through hole and the locking hole to secure the data storage device in the drive bracket of the chassis;
wherein an elastic member is pivotally mounted on the side plate, the rotating member is placed on the elastic member, the elastic member and the rotating member are capable of rotation; the elastic member is elastically deformed to store an elastic force which can drive the rotating member rotating to remove the positioning pin from the locking hole when the cover is detached from the chassis.

2. The enclosure of claim 1, wherein the elastic member comprises a pair of legs, one end of each of the legs forms a foot, the feet of the elastic member are pivotally mounted on the side plate, the legs are tilted with respect to the side plate, and the rotating member are placed on the legs.

3. The enclosure of claim 2, wherein the side plate forms a pair of arches thereon, a receiving hole is defined between each arch and the side plate, and the feet of the elastic member are pivotally located in the receiving holes.

4. The enclosure of claim 1, wherein the rotating member defines a receiving space which receives the elastic member therein.

5. The enclosure of claim 1, wherein the side plate comprises a pair of flanges, each flange defines a pivoting hole therein, the rotating member has a pair of pivoting pins pivotally located in the pivoting holes.

6. The enclosure of claim 1, wherein an inner side of the drive bracket forms a plurality of dividing pieces, a plurality of slideways are defined between the plurality of dividing pieces, the data storage is received in a slideway.

7. An enclosure for electronic device, comprising:
a chassis comprising a drive bracket mounted therein, the drive bracket comprising a side plate and a through hole defined in the side plate; a data storage device received in the drive bracket, the data storage device defining a locking hole in alignment with the through hole of the side plate; an elastic member and a rotating member pivotally mounted on the side plate, the elastic member tilted with respect to the side plate, the rotating member placed on the elastic member, the rotating member comprising a positioning pin; and
a cover mounted on the chassis, the cover abuts the rotating member so that the positioning pins of the rotating member are inserted in the through hole and the locking hole, and the elastic member is elastically deformed to store an elastic force which can drive the rotating member rotating to remove the positioning pin from the locking hole after the cover is detached from the chassis.

8. The enclosure of claim 7, wherein the chassis defines an opening covered by the cover, and the side plate faces the opening.

9. The enclosure of claim 7, wherein the elastic member comprises a pair of legs, one end of each of the legs forms a foot, the feet of the elastic member is pivotally mounted on the side plate, the legs are tilted with respect to the side plate, and the rotating member are placed on the legs.

10. The enclosure of claim 9, wherein the side plate forms a pair of arches thereon, a receiving hole is defined between each arch and the side plate, and the feet of the elastic member are pivotally located in the receiving holes.

11. The enclosure of claim 7, wherein the rotating member defines a receiving space which receives the elastic member therein.

12. The enclosure of claim 7, wherein the side plate comprises a pair of flanges, each flange defines a pivoting hole therein, the rotating member has a pair of pivoting pins pivotally located in the pivoting holes.

13. The enclosure of claim 7, wherein an inner side of the drive bracket forms a plurality of dividing pieces, a plurality of slideways are defined between the plurality of dividing pieces, the data storage is received in a slideway.

* * * * *